United States Patent
Kim et al.

(10) Patent No.: US 9,570,526 B2
(45) Date of Patent: Feb. 14, 2017

(54) ORGANIC LIGHT EMITTING DISPLAY DEVICE AND MANUFACTURING METHOD THEREOF

(71) Applicant: SAMSUNG DISPLAY CO., LTD., Yongin, Gyeonggi-Do (KR)

(72) Inventors: Jeong-Hwan Kim, Yongin (KR); Seong-Kweon Heo, Yongin (KR); Jong-Hyun Park, Yongin (KR); Chang-ho Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 72 days.

(21) Appl. No.: 14/535,277

(22) Filed: Nov. 6, 2014

(65) Prior Publication Data

US 2015/0155342 A1 Jun. 4, 2015

(30) Foreign Application Priority Data

Dec. 2, 2013 (KR) ........................ 10-2013-0148648

(51) Int. Cl.
*H01L 27/32* (2006.01)
*H01L 51/00* (2006.01)
*H01L 51/52* (2006.01)
*H01L 51/56* (2006.01)

(52) U.S. Cl.
CPC ....... *H01L 27/3248* (2013.01); *H01L 27/3276* (2013.01); *H01L 51/0023* (2013.01); *H01L 51/5203* (2013.01); *H01L 51/56* (2013.01)

(58) Field of Classification Search
CPC ............. H01L 27/3244; H01L 27/3276; H01L 27/1248; H01L 29/4908
See application file for complete search history.

(56) References Cited

U.S. PATENT DOCUMENTS

| 2005/0012694 A1* | 1/2005 | Park ..................... G09G 3/3233 345/76 |
|---|---|---|
| 2011/0114960 A1 | 5/2011 | Lee et al. |
| 2013/0026475 A1 | 1/2013 | Choi et al. |
| 2013/0032803 A1 | 2/2013 | Moon et al. |
| 2013/0069067 A1 | 3/2013 | Youn |
| 2013/0112979 A1 | 5/2013 | Nam et al. |

FOREIGN PATENT DOCUMENTS

| KR | 10-2011-0053804 A | 5/2011 |
|---|---|---|
| KR | 10-2013-0013516 A | 2/2013 |
| KR | 10-2013-0049104 A | 5/2013 |

* cited by examiner

*Primary Examiner* — Seahvosh Nikmanesh
(74) *Attorney, Agent, or Firm* — Lewis Roca Rothgerber Christie LLP

(57) ABSTRACT

An organic light emitting display device and a method for manufacturing the organic light emitting display device, which includes a light emitting region and a non-light emitting region, and having an organic light emitting element including first and second electrodes disposed in the light emitting region and an organic emission layer formed between the two electrodes, a driving voltage supply line disposed in the non-light emitting region and providing a driving voltage to the first and second electrodes, and a contact part disposed in the non-light emitting region and disposed to be in contact with the first electrode to supply the driving voltage provided from the driving voltage supply line to the first electrode, wherein the contact part is formed as multiple layers patterned such that a second conductive layer covers a first conductive layer.

6 Claims, 3 Drawing Sheets

ORGANIC LIGHT EMITTING DISPLAY DEVICE AND MANUFACTURING METHOD THEREOF

CROSS-REFERENCE TO RELATED APPLICATION

This application claims priority to and the benefit of Korean Patent Application No. 10-2013-0148648, filed on Dec. 2, 2013, in the Korean Intellectual Property Office, the entire contents of which are incorporated herein by reference in their entirety.

BACKGROUND

1. Field

The present invention relates to an organic light emitting display device and a manufacturing method thereof.

2. Description of the Related Art

An organic light emitting display device is a self-luminous display device that displays an image with an organic light emitting element that emits light. Unlike a liquid crystal display (LCD), an organic light emitting display device does not need a light source, so thickness and weight thereof may be reduced.

Also, an organic light emitting display device has high quality characteristics such as low power consumption, high luminance, and high response speed, and the like, so it has come to prominence as a next-generation display device for electronic devices.

In general, an organic light emitting element includes an organic emitting layer (EML) interposed between first and second electrodes, so when a voltage is applied to the respective electrodes, holes supplied from the first electrode and electrons supplied from the second electrode are injected into the organic emitting layer and recombined therein to form excitons as hole-electron pairs, and light is emitted by energy generated as the excitons are returned to a ground state.

The first and second electrodes are connected to wirings corresponding thereto to receive a driving voltage from an external driving unit and apply an electric field to the organic emitting layer.

Meanwhile, the first and second electrodes are electrically connected to the external driving unit (including the wirings) through a contact part positioned in a non-emitting region of a substrate. The contact part may be configured as driving voltage wirings electrically connected to the first or the second electrode through a contact hole, or the like.

The driving voltage wirings positioned in the contact part may be composed of layers including a transparent conductive layer, a gate electrode layer, a data electrode layer, and the like, formed on the substrate, and may be patterned through a collective (or integrated) etching process.

In performing the collective etching process, a lateral surface of a gate electrode layer is etched to have an under-cut structure, and an air gap is generated in the under-cut portion.

The air gap generated due to the under-cut structure may cause cracks or discontinuation of an insulating layer formed on an upper portion of the gate electrode layer, and as a result, an insulating function may be degraded to generate a short-circuit between the gate electrode layer and the data electrode layer.

In addition, after the patterning process formed on the contact part, a cleaning process is performed, and in this case, moisture, or the like, may remain in the under-cut structure to affect a follow-up process, making the contact part defective.

SUMMARY

An embodiment of the present invention relates to an organic light emitting display device and a manufacturing method thereof capable of minimizing an under-cut defect in an electrode contact part.

An organic light emitting display device including a light emitting region and a non-light emitting region according to an embodiment of the present invention, includes an organic light emitting element including first and second electrodes disposed in the light emitting region and an organic emission layer formed between the two electrodes; a driving voltage supply line disposed in the non-light emitting region and providing a driving voltage to the first and second electrodes; and a contact part disposed in the non-light emitting region and disposed to be in contact with the first electrode to supply the driving voltage provided from the driving voltage supply line to the first electrode, wherein the contact part is formed as multiple layers patterned such that a second conductive layer covers a first conductive layer.

The first electrode layer may be a gate electrode layer, and the second conductive layer may be a data electrode layer.

The first and second conductive layers are collectively etched.

The contact part may further include a metal layer formed below the first conductive layer and electrically connected to the first electrode via a contact hole.

The metal layer may be formed of a transparent conductive material.

The first electrode may be a pixel electrode.

The pixel electrode may be an anode electrode.

A method for manufacturing an organic light emitting display device according to an embodiment of the present invention, includes: forming a first conductive pattern on a substrate including a light emitting region and a non-light emitting region defined thereon; forming a first metal layer directly in contact with the first conductive pattern formed in the non-light emitting region on the first conductive pattern; sequentially forming an interlayer insulating layer and a second metal layer on the first metal layer; collectively etching the first and second metal layers to pattern the first metal layer to form a second conductive pattern exposing a portion of the first conductive pattern and simultaneously patterning the second metal layer covering edges of the second conductive pattern to form a third conductive pattern; and forming a pixel electrode electrically connected to the exposed first conductive pattern of the non-light emitting region in the light emitting region.

The forming of the second and third conductive patterns may include: sequentially depositing a photoresist layer on the entire surface of the substrate with the interlayer insulating layer and the second metal layer and forming a photoresist pattern exposing a portion of the second metal layer; and exposing the substrate with the photoresist pattern formed thereon to an etching solution to simultaneously remove the exposed second metal layer and the first metal layer deposited to correspond to the second metal layer below the second metal layer to pattern the first and second metal layers exposing a portion of the first conductive pattern.

The second conductive pattern may be a gate electrode layer, and the third conductive pattern may be a data electrode layer.

The pixel electrode may be an anode electrode.

The first conductive pattern may be formed of a transparent conductive material.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
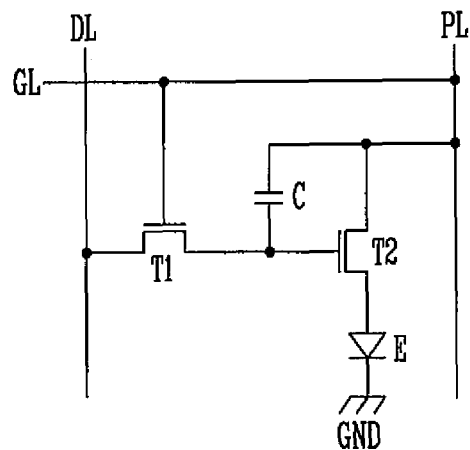
FIG. 1 is a circuit diagram of a pixel of an organic light emitting display device according to an embodiment of the present invention.

Details of embodiments are included in the following detailed description and drawings.

The advantages and features of the present invention and methods for achieving these will be clarified in detail through embodiments described hereinafter in conjunction with the accompanying drawings.

However, embodiments of the present invention may be implemented in many different forms and should not be construed as being limited to the embodiments set forth herein. Rather, these embodiments are provided so that this disclosure will be thorough and complete, and will convey the scope of the invention to those skilled in the art as defined by the claims of the present invention. Throughout the specification, the same reference numerals will be used to designate the same or like components.

In order to clarify the present invention, parts that are not connected with the description will be omitted, and since sizes and thickness of respective components are arbitrarily shown for the description purpose, the present invention is not necessarily limited to the illustration.

In the drawings, the thickness of layers, films, regions, etc., are exaggerated for clarity. Also, in the drawings, the thickness of some layers and regions are exaggerated for the sake of brevity.

It will be understood that when an element such as a layer, film, region, or substrate is referred to as being "on" another element, it can be directly on the other element or intervening elements may also be present.

Hereinafter, an organic light emitting display device and a manufacturing method thereof according to embodiments of the present invention will be described with reference to the accompanying drawings.

Figure 2:
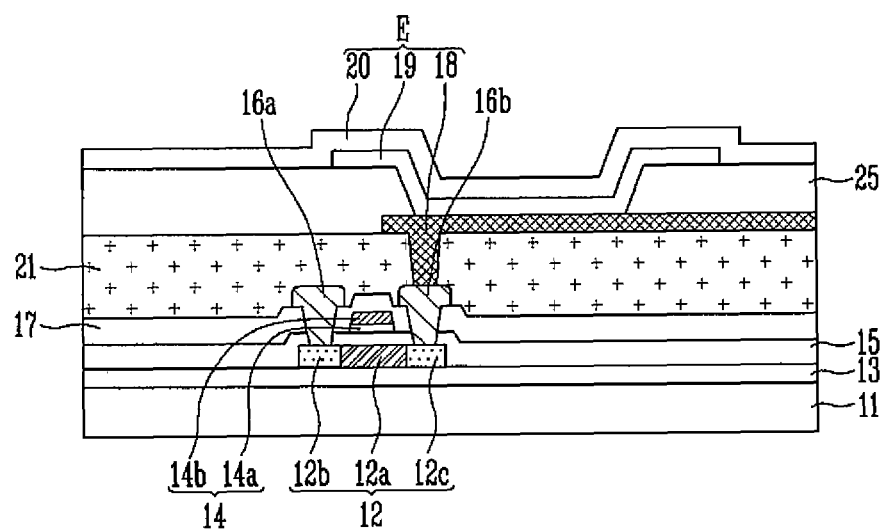
FIG. 2 is a schematic cross-sectional view of a driving transistor of FIG. 1.

FIG. 1 is an circuit diagram of a pixel of an organic light emitting display device according to an embodiment of the present invention, and FIG. 2 is a schematic cross-sectional view of a driving transistor of FIG. 1.

Referring to FIGS. 1 and 2, a pixel of the organic light emitting display device according to an embodiment of the present invention includes a switching thin film transistor (TFT) T1 connected to a gate line GL and a data line DL, a driving TFT T2 connected to the switching TFT T1, a power line PL, an organic light emitting element E and a storage capacitor C connected between the power line PL and a drain electrode of the switching TFT T1, the organic light emitting element E is connected to the driving TFT T2.

When a scan pulse is supplied to the gate line GL, the switching TFT T1 is turned on to supply a data signal supplied to the data line DL to the storage capacitor C and a gate electrode of the driving TFT T2.

In response to the data signal supplied to the gate electrode of the driving TFT T2, the driving TFT T2 controls a current supplied to the organic light emitting element E from the power line PL to adjust an amount of light emitted by the organic light emitting element.

Although the switching TFT T1 is turned off, the driving TFT T2 supplies a predetermined current with the voltage charged in the storage capacitor C until a data signal of a next frame is supplied, thus maintaining light emission of the organic light emitting element E.

As illustrated in FIG. 2, the driving TFT T2 includes a buffer layer 13 formed on a substrate 11, and a semiconductor layer 12 is formed on the buffer layer 13 and includes an active layer 12a and source and drain regions 12b and 12c A first insulating layer 15 is formed on the semiconductor layer 12, and is formed in a region of the first insulating layer 15 having a size corresponding to a width of the active layer 12a A second insulating layer 17 is formed on the gate electrode 14 Source and drain electrodes 16a and 16b are formed on the second insulating layer 17, and a protective layer 21 is formed on the source and drain electrodes 16a and 16b.

The gate electrode 14 of the driving TFT T2 may include first and second gate electrodes 14a and 14b formed by sequentially stacking metal layers formed of different materials.

The drain electrode 16b of the driving TFT T2 is electrically connected to the first electrode 18 through a through hole formed in the protective layer 21.

The protective layer 21 having the first electrode 18 formed therein includes a pixel defining layer 25 having an opening exposing a region of the first electrode 18, an organic emission layer 19 formed on the pixel defining layer 25, and a second electrode 20 formed on the pixel defining layer 25 including the organic emission layer 19.

The first and second electrodes 18 and 20 and the organic emission layer 19 formed therebetween constitute an organic light emitting element E.

The first electrode 18 of the organic light emitting element E may be an anode electrode formed in every pixel, serving as a pixel electrode, and the second electrode may be a cathode electrode formed on the entire surface of the substrate 11, serving as a common electrode. In this embodiment, the polarities of the first and second electrodes 18 and 20 may be reversed.

In an embodiment of a bottom emission type display device in which an image is implemented in a direction of the substrate 11, the first electrode 18 may be a transparent electrode and the second electrode 20 may be a reflective electrode. In this example, the first electrode 18 may be formed of a conductive compound such as ITO, IZO, ZnO, In$_2$O$_3$, or the like, having a high work function, and the second electrode 20 may be formed of a metal having a low work function, i.e., Ag, Mg, Al, Pt, Pd, Au, Ni, Nd, Ir, Cr, Li, or Ca.

In an embodiment of a top emission type display device in which an image is implemented in a direction of the second electrode 20, the first electrode 18 may be provided as a reflective electrode and the second electrode 20 may be provided as a transparent electrode. In this embodiment, the reflective electrode as the first electrode 18 may include a reflective film formed of Ag, Mg, Al, Pt, Pd, Au, Ni, Nd, Ir, Cr, Li, Ca, a compound thereof, or the like, and ITO, IZO, ZnO, In$_2$O$_3$, or the like, having a high work function. The transparent electrode as the second electrode 20 may be formed by depositing a metal having a low work function, namely, Ag, Mg, Al, Pt, Pd, Au, Ni, Nd, Ir, Cr, Li, Ca, and a compound thereof and forming an auxiliary electrode layer or a bus electrode line formed of a transparent conductive material such as ITO, IZO, ZnO, In$_2$O$_3$, or the like, thereon.

In an embodiment of a dual-type display device, both the first and second electrodes 18 and 20 may be formed as transparent electrodes.

The first and second electrodes 18 and 20 may not necessarily be formed of the foregoing materials, and may be formed of a conductive organic material or a conductive paste including conductive particles such as Ag, Mg, Cu, or the like. In the case of using a conductive paste, the conductive paste may be printed by using an inkjet printing method, and after the printing operation, the paste may be sintered so as to be formed as an electrode.

Meanwhile, the first electrode 18 receives a source voltage from the power line PL, and is electrically connected to the power line PL by an electrode contact part (not shown). The electrode contact part is positioned in a non-light emitting region to electrically connect the first electrode 18 formed in a pixel and the power line PL.

Figure 3:
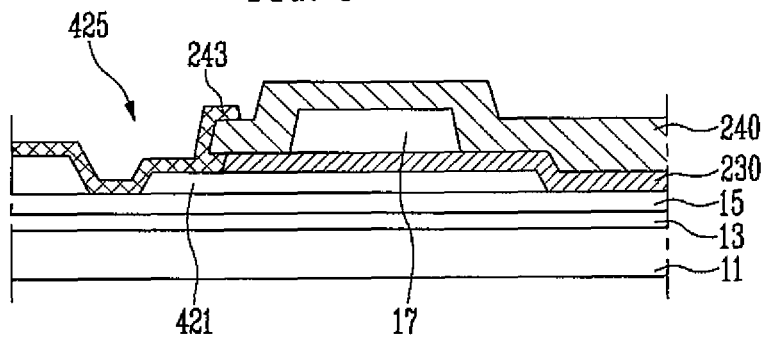
FIG. 3 is a schematic cross-sectional view of an electrode contact part and a power line in the organic light emitting display device according to an embodiment of the present invention.

FIG. 3 is a schematic cross-sectional view of the electrode contact part and the power line in the organic light emitting display device according to an embodiment of the present invention.

Referring to FIG. 3, the electrode contact part and the power line of the organic light emitting display device includes the buffer layer 13 formed on the substrate 11, the first insulating layer 15 formed on the buffer layer 13, a first metal pattern 421 formed on the first insulating layer 15, a second metal pattern 230 formed on the first metal pattern 421, a third metal pattern 240 formed on the second metal pattern 230 to cover the second metal pattern 230, and a conductive layer 243 electrically connected to the first metal pattern 421 through a contact hole 425.

Also, the contact part of the organic light emitting display device further includes a second insulating layer 17 formed between the second and third metal patterns 230 and 240.

The second and third metal patterns 230 and 240 formed on the substrate 11 with the second insulating layer 17 interposed therebetween form the power line PL, and the first metal pattern 421 serves as an electrode contact part electrically connecting the power line PL and the conductive layer 243 extending from the first electrode (18 in FIG. 2).

The substrate 11 may be formed a material having excellent mechanical strength or dimensional stability. A material of the substrate 11 may be, for example, a glass plate, a metal plate, a ceramic plate, plastic (a polycarbonate resin, an acrylic resin, a polyvinyl chloride resin, a polyethyleneterephthalate resin, a polyimide resin, a polyester resin, an epoxy resin, a silicon resin, a fluoride resin, and the like), and the like, but the present disclosure is not limited thereto.

The buffer layer 13 may be formed to protect driving elements formed in a follow-up process from impurities such as an alkali ion, or the like, effused from the substrate 11, and may be omitted according to a particular material of the substrate 11.

The first and second insulating layers 15 and 17 are formed as a silicon oxide film SiO$_2$, a silicon nitride film SiN$_2$, or a dual-layer thereof, and serve to insulate metal layers positioned in lower and upper portions thereof.

The first metal pattern 421 may be formed on the first insulating layer 15, may be electrically connected to the conductive layer 243 through the contact hole 425 formed in a follow-up process, and may be formed of the same material as that of the first gate electrode 14a through the same process in which the first gate electrode 14a is formed.

For example, the first metal pattern 421 may be formed of indium tin oxide (ITO) as a transparent conductive material, or the like.

In this embodiment, the conductive layer 243 extends from the first electrode 18 and is electrically connected to the drain electrode 16b of the driving TFT T2, and here, the conductive layer 243 is referred to differently so as to be discriminated from the first electrode 18.

The conductive layer 243 and the extending first electrode 18 are electrically connected to the power line PL through the first metal pattern 421 so as to be provided with a source voltage from the power line PL.

The second metal pattern 230 is formed of a conductive metal and is formed directly on the first metal pattern 421. The second metal pattern 230 may be formed of one type of material selected from the group consisting of aluminum (Al), an aluminum alloy, tungsten (W), molybdenum (Mo), chromium (Cr), titanium (Ti), and the like.

The second metal pattern 230 may be formed of a material identical to that of the second gate electrode 14b of the driving TFT T2 through the same process.

The third metal pattern 240 is formed of one or more types of material selected from the group consisting of chromium (Cr), molybdenum (Mo), tungsten (W), molybdenum-tungsten (MoW), titanium (Ti), aluminum (Al), an aluminum alloy, and the like, and may cover the second metal pattern 230 on the second insulating layer 17.

The third metal pattern 240 may be formed of a material identical to that of the source and drain electrodes 16a and 16b of the driving TFT T2 through the same process in which the source and drain electrodes 16a and 16b are formed.

The second and third metal patterns 230 and 240 are simultaneously etched to be patterned, and here, since the third metal pattern 240 covers the second metal pattern 230, a degree of etching the side of the second metal pattern 230 is controlled to prevent the generation of an under-cut structure as the lateral portion of the second metal pattern 230 is over-etched.

Since the third metal pattern 240 covers the side of the second metal pattern 230, the lateral portion of the second metal pattern 230 is not over-etched during an etching process, thus preventing an under-cut structure of the second metal pattern 230 and reducing the generation of an air gap due to an under-cut structure which prevents a defective structure.

Hereinafter, a method for manufacturing the electrode contact part will be described in detail.

FIGS. 4A through 4E are cross-sectional views sequentially illustrating a process of manufacturing the electrode contact part and the power line of FIG. 3.

Figure 4A:
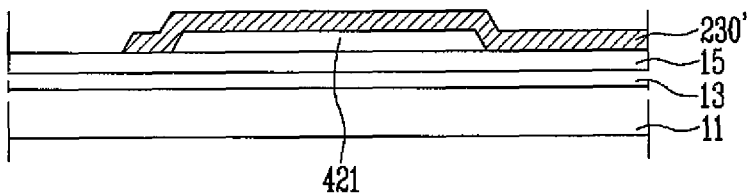
FIGS. 4A through 4E are cross-sectional views sequentially illustrating a process of manufacturing the electrode contact part and the power line of FIG. 3.

As illustrated in FIG. 4A, the buffer layer 13, the first insulating layer 15, and the first metal pattern 421 are formed of a transparent conductive material and are sequentially formed on the substrate 11.

Subsequently, a second metal layer 230' covering the entirety of the first metal pattern 421 is formed on the substrate 11 with the first metal pattern 421 formed thereon.

Aluminum (Al), an aluminum alloy, titanium (Ti), silver (Ag), molybdenum (Mo), a molybdenum alloy, tungsten (W), a tungsten silicide ($WSi_2$), or the like, may be used as a material of the second metal layer 230', for example, but the present disclosure is not limited thereto.

In this embodiment, the second metal layer 230' may be patterned to expose a portion of the first insulating layer 15 on the substrate 11.

Figure 4B:
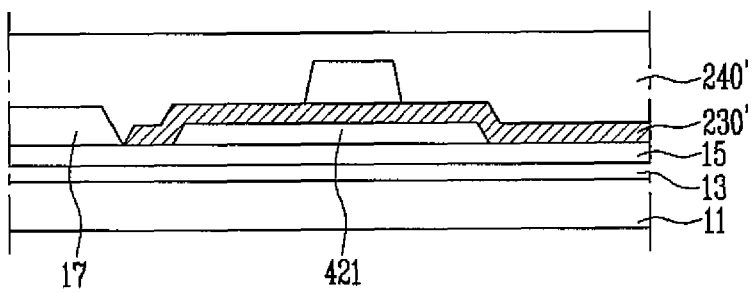

Thereafter, as illustrated in FIG. 4B, the second insulating layer 17 is formed on the substrate 11 with the second metal layer 230' formed thereon. Also, a third metal layer 240' is formed on the entire surface of the substrate 11 with the second insulating layer 17 formed thereon.

In this embodiment, the second insulating layer 17 may be patterned through photolithography such that the second insulating layer 17 is formed in an exposed portion of the first insulating layer 15 and in a portion of the second metal layer 230'A dry etching method may be used as an etching method, but the present disclosure is not limited thereto.

The third metal layer 240' is formed on the entire surface of the substrate 11 with the patterned second insulating layer 17 formed thereon. The third metal layer 240' may be formed of a material such as aluminum (Al), alminerium (AlNd), molybdenum (Mo), chromium (Cr), titanium nitride (TiN), molybdenum nitride (MoN), chromium nitride (CrN), or the like, and may be formed as a single layer or formed as a multilayer structure, but the present disclosure is not limited thereto.

Figure 4C:
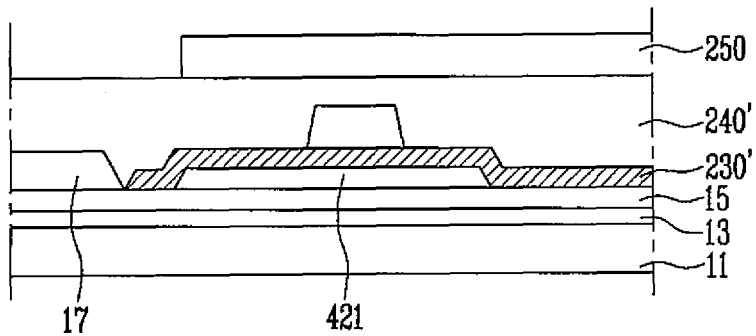

Thereafter, as illustrated in FIG. 4C, a photoresist pattern 250 exposing a portion of the third metal layer 240' is formed on the substrate 11 with the third metal layer 240' formed thereon.

Figure 4D:
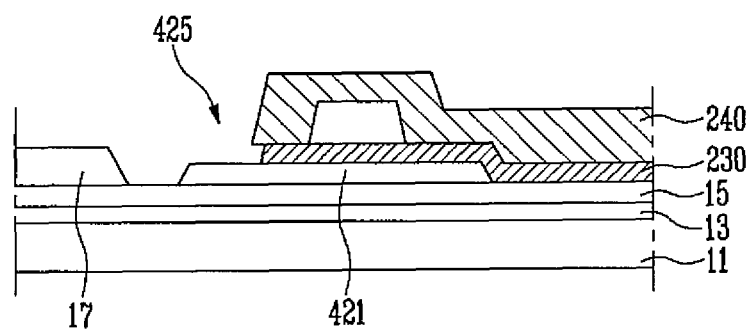

Subsequently, as illustrated in FIG. 4D, an etching process is performed on the third metal layer 240' formed on the substrate 11 by using the photoresist pattern 250 as a mask to form the third metal pattern 240 exposing the second insulating layer 17 formed in a partial region of the substrate 11.

When the third metal layer 240' is etched, the second metal layer 230' is also simultaneously etched to form the second metal pattern 230 including the contact hole 425 exposing a portion of the first metal pattern 421 on the substrate 11.

Since the third metal layer 240' is formed to cover the second metal layer 230' on the substrate 11, a lateral portion of the second metal layer 230' is not over-etched during the etching process, eliminating an under-cut form.

Figure 4E:
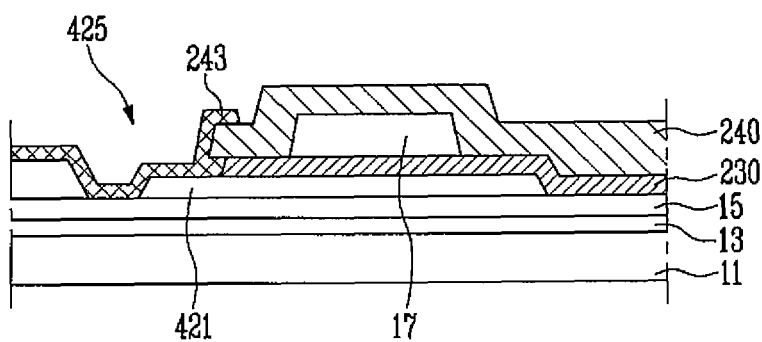

As illustrated in FIG. 4E, the conductive layer 243 is formed to extend from the first electrode (18 in FIG. 2) and is electrically connected to the first metal pattern 421 via the contact hole 425 on the substrate 11 with the second and third metal patterns 230 and 240 formed thereon. The conductive layer 243 extends from the first electrode (18 in FIG. 2), is formed of a material identical to that of the first electrode 18, and is formed through the same process in which the first electrode 18 is formed.

As described above, since the lateral portion of the second metal pattern 230 does not have an under-cut structure in the electrode contact part of the organic light emitting display device, generation of an air gap due to an under-cut structure may be minimized, and thus, a defect due to an air gap may be prevented.

By way of summation and review, in the case of the organic light emitting display device and the manufacturing method thereof according to embodiments of the present invention, an under-cut structure of a gate electrode in an electrode contact part can be prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display device including a light emitting region and a non-light emitting region, the organic light emitting display device comprising:
    an organic light emitting element including a first electrode and a second electrode disposed in the light emitting region and an organic emission layer formed between the first electrode and the second electrode;
    a driving voltage supply line disposed in the non-light emitting region and providing a driving voltage to the first electrode; and
    a contact part disposed in the non-light emitting region and disposed to be in contact with a conductive layer extended from the first electrode to supply the driving voltage provided from the driving voltage supply line to the first electrode,
    wherein the contact part is formed as multiple layers patterned such that a second conductive layer covers a first conductive layer, the contact part further comprising a metal layer formed below the first conductive layer and electrically connected to the first electrode via a contact hole, the conductive layer extended from the first electrode being in contact with each of an upper surface of the metal layer and a lateral portion of the first conductive layer, and surrounding a lateral portion of the second conductive layer in the non-light emitting region, and
    wherein the contact part further comprises an interlayer insulating layer formed between the first conductive layer and the second conductive layer.

2. The organic light emitting display device of claim 1, wherein the first conductive layer is a gate electrode layer, and the second conductive layer is a data electrode layer.

3. The organic light emitting display device of claim 2, wherein the first conductive layer and the second conductive layer are collectively etched.

4. The organic light emitting display device of claim 1, wherein the metal layer is formed of a transparent conductive material.

5. The organic light emitting display device of claim 1, wherein the first electrode is a pixel electrode.

6. The organic light emitting display device of claim 5, wherein the pixel electrode is an anode electrode.

\* \* \* \* \*